United States Patent
Hoshi

(10) Patent No.: US 9,972,572 B2
(45) Date of Patent: May 15, 2018

(54) SEMICONDUCTOR DEVICE HAVING A BARRIER LAYER

(71) Applicant: FUJI ELECTRIC CO., LTD., Kanagawa (JP)

(72) Inventor: Yasuyuki Hoshi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days. days.

(21) Appl. No.: 15/475,059

(22) Filed: Mar. 30, 2017

(65) Prior Publication Data
US 2017/0207174 A1    Jul. 20, 2017

Related U.S. Application Data

(63) Continuation of application No. PCT/JP2016/055112, filed on Feb. 22, 2016.

(30) Foreign Application Priority Data

Apr. 20, 2015    (JP) .................................. 2015-085620

(51) Int. Cl.
*H01L 23/532*    (2006.01)
*H01L 27/06*    (2006.01)
(Continued)

(52) U.S. Cl.
CPC .... *H01L 23/53223* (2013.01); *H01L 27/0629* (2013.01); *H01L 29/4966* (2013.01); *H01L 29/8611* (2013.01)

(58) Field of Classification Search
CPC ... H01L 21/28; H01L 23/53223; H01L 27/04; H01L 27/0629; H01L 29/06; H01L 29/12;
(Continued)

(56) References Cited

U.S. PATENT DOCUMENTS 5,100,615 A    3/1992 Oguro et al.
5,712,502 A    1/1998 Mitlehner et al.
(Continued)

FOREIGN PATENT DOCUMENTS

JP    H02-77128 A    3/1990
JP    H07-326144 A    12/1995
(Continued)

OTHER PUBLICATIONS

Office Action issued for counterpart Japanese Application 2017-513995, issued by the Japan Patent Office dated Sep. 5, 2017.
(Continued)

*Primary Examiner* — Shahed Ahmed

(57) ABSTRACT

Provided is a semiconductor device including a semiconductor substrate, an electrode provided on a front surface of the semiconductor substrate, where the electrode contains aluminum, a barrier layer provided between the semiconductor substrate and the electrode. Here, the barrier layer includes a first titanium nitride layer, a first titanium layer, a second titanium nitride layer and a second titanium layer in a stated order with the first titanium nitride layer being positioned closest to the semiconductor substrate.

13 Claims, 12 Drawing Sheets

(51) Int. Cl.
H01L 29/861 (2006.01)
H01L 29/49 (2006.01)

(58) Field of Classification Search
CPC ... H01L 29/4966; H01L 29/78; H01L 29/861;
H01L 29/8611; H01L 29/868
USPC .......... 257/284, 330, 332, 515; 438/44, 361,
438/270
See application file for complete search history.

(56) References Cited

U.S. PATENT DOCUMENTS

| | | | |
|---|---|---|---|
| 5,945,692 | A | 8/1999 | Yano et al. |
| 5,951,945 | A | 9/1999 | Komada et al. |
| 8,093,676 | B2 | 1/2012 | Schmidt |
| 9,570,542 | B2 | 2/2017 | Breymesser et al. |
| 9,595,469 | B2 | 3/2017 | Hilsenbeck et al. |
| 9,666,676 | B2 | 5/2017 | Ogino |
| 2002/0036346 | A1* | 3/2002 | Harada ............. H01L 21/76807 257/751 |
| 2002/0132426 | A1 | 9/2002 | Shinohara et al. |
| 2005/0101132 | A1 | 5/2005 | Kim et al. |
| 2011/0241130 | A1* | 10/2011 | Chan ................. H01L 21/28079 257/410 |
| 2014/0299887 | A1 | 10/2014 | Matocha et al. |
| 2015/0115285 | A1 | 4/2015 | Kinoshita et al. |
| 2015/0243753 | A1 | 8/2015 | Suekawa et al. |
| 2016/0093748 | A1 | 3/2016 | Mieczkowski et al. |
| 2017/0207174 | A1 | 7/2017 | Hoshi |

FOREIGN PATENT DOCUMENTS

| | | | |
|---|---|---|---|
| JP | 2002-280523 | A | 9/2002 |
| JP | 2003-197773 | A | 7/2003 |
| JP | 2004-525510 | A | 8/2004 |
| JP | 2005-175357 | A | 6/2005 |
| JP | 2009-194127 | A | 8/2009 |
| JP | 2011-199141 | A | 10/2011 |
| JP | 2012-129503 | A | 7/2012 |
| JP | 2012-186318 | A | 9/2012 |
| JP | 2013-98316 | A | 5/2013 |
| JP | 2013-201357 | A | 10/2013 |
| JP | 2013-232564 | A | 11/2013 |
| JP | 2014-127487 | A | 7/2014 |

OTHER PUBLICATIONS

K.Shenai et al., Optimum Semiconductors for High-Power Electronics, IEEE Transactions on Electron Devices, Sep. 1989, vol. 36,Issue:9, pp. 1811-1823.
B.Jayant Baliga, Silicon Carbide Power Devices,US, World Scientific Publishing Company,Mar. 30, 2006, p. 61.
International Search Report for International Patent Application No. PCT/JP2016/061206, issued by the Japan Patent Office dated Jun. 21, 2016.
International Search Report for International Patent Application No. PCT/JP2016/055112, issued by the Japan Patent Office dated May 24, 2016.
Office Action issued for counterpart Japanese Application 2017-514055, issued by the Japan Patent Office dated Aug. 15, 2017.
M.Pozzo, D. Alfe, "Hydrogen dissociation and diffusion on transition metal (=Ti, Zr, V, Fe, Ru, Co, Rh, Ni, Pd, Cu, Ag)-doped Mg (0001) surfaces", Internationl Journal of Hydrogen Energy, vol., 34 2009, Elsevier, pp. 1922-1930.
Office Action issued for counterpart U.S. Appl. No. 15/475,144, issued by the USPTO dated Jan. 23, 2018.

* cited by examiner

SEMICONDUCTOR DEVICE HAVING A BARRIER LAYER

The contents of the following Japanese patent applications are incorporated herein by reference:
NO. 2015-085620 filed in JP on Apr. 20, 2015, and
NO. PCT/JP2016/055112 filed on Feb. 22, 2016.

BACKGROUND

1. Technical Field

The present invention relates to a semiconductor device.

In the conventional semiconductor devices, a barrier metal layer is provided to prevent the corrosion of an interlayer insulating film and the shorting between the gate and source electrodes made of polysilicon, which are caused by aluminum (Al) contained in the source electrode. A barrier metal layer is also provided between a polysilicon layer and the anode electrode containing Al and the cathode electrode containing Al, in order to improve the electrical contact (see, for example, Japanese Patent Application Publication 2012-129503). In addition, regarding a semiconductor device made of silicon carbide (SiC), a known temperature element monitor uses an npn bipolar structure (see, for example, Japanese Patent Application Publication 2013-201357).

After the deposition of the source electrode containing Al, the source electrode is sintered at a temperature of approximately 400° C. During the sintering step, the hydrogen contained in the Al enters the semiconductor device. Since the hydrogen is reductive, the hydrogen draws the oxygen contained in the semiconductor device. As a result, the insulating film made of silicon dioxide or the like, which is used as the gate insulating film, may change in property. The change in property disadvantageously shifts the gate voltage threshold (Vth) of the gate structure. In light of the above, a semiconductor device is provided that is structured to prevent hydrogen from entering the semiconductor device.

SUMMARY

A first aspect of the innovations herein provides a semiconductor device including a semiconductor substrate, an electrode provided on a front surface of the semiconductor substrate, where the electrode contains aluminum, a barrier layer provided between the semiconductor substrate and the electrode. Here, the barrier layer includes a first titanium nitride layer, a first titanium layer, a second titanium nitride layer and a second titanium layer in a stated order with the first titanium nitride layer being positioned closest to the semiconductor substrate.

The second titanium layer may have a larger thickness than the first titanium layer. Each of the first titanium layer and the second titanium layer may have a smaller thickness than either of the first titanium nitride layer and the second titanium nitride layer. Each of the first titanium layer and the second titanium layer may have a thickness of no less than 10 nm and no more than 50 nm, and each of the first titanium nitride layer and the second titanium nitride layer has a thickness of no less than 50 nm and no more than 200 nm.

The semiconductor device may further include an active region including a gate structure, and an element region that is different from the active region and includes a semiconductor element provided on the front surface of the semiconductor substrate. The barrier layer may be provided between the electrode containing aluminum and the semiconductor element. The semiconductor element may be a pn-junction diode, and the electrode containing aluminum may be an electrode electrically connected to the pn-junction diode.

The element region may further include an insulating film provided on the front surface of the semiconductor element. The barrier layer may also cover a front surface of the insulating film that extends from the active region to the element region.

The insulating film may have therein a contact hole through which the semiconductor element is electrically connected to the electrode containing aluminum, and the barrier layer may also cover a side wall of the contact hole. When the semiconductor substrate is seen from above, the barrier layer may occupy a larger region than the element region.

The gate structure in the active region may further include a gate electrode; and the barrier layer positioned on a front surface of the gate electrode. An end, in the active region, of the barrier layer that faces the element region may be spaced away by no less than 10 μm and no more than 20 μm from an end, in the element region, of the barrier layer that faces the active region. The semiconductor device may further include an interlayer insulating film between the electrode positioned on the front surface of the gate electrode and the gate electrode. The barrier layer may be provided between the electrode positioned closer to the front surface of the gate structure than the gate electrode is and the interlayer insulating film.

The semiconductor device may further include an edge termination structure extending along an edge of the semiconductor substrate. The barrier layer may be provided on a front surface of the edge termination structure, and the barrier layer on the edge termination structure has a floating potential. The electrode containing aluminum may not cover a front surface of the barrier layer on the edge termination structure.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
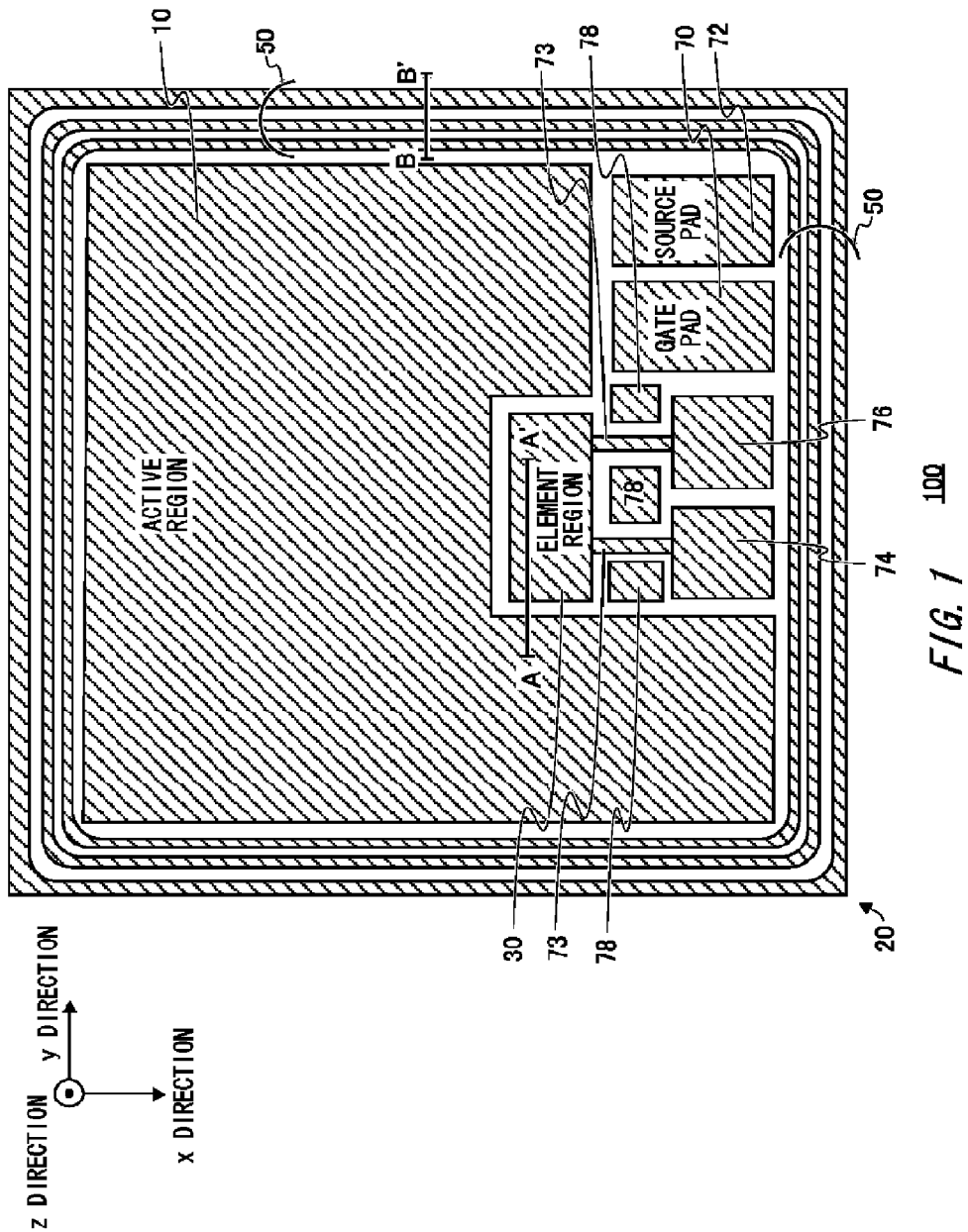
FIG. 1 is a plan view showing a semiconductor device 100 relating to a first embodiment.

FIG. 1 is a plan view showing a semiconductor device 100 relating to a first embodiment. In other words, FIG. 1 shows how the semiconductor substrate 20 looks when seen from above. The semiconductor device 100 has a plane parallel to the x-y plane. The x and y directions are perpendicular to each other and the z direction is perpendicular to the x-y plane. As used herein, the front and back surfaces of an object having a plane parallel to the x-y plane are respectively defined as the surface facing the z direction and the surface facing the −z direction. The surfaces of the object positioned between the front surface and the back surface are referred to as the side surfaces of the object.

The semiconductor device 100 includes a semiconductor substrate 20. The semiconductor device 100 includes, on the front surface of the semiconductor substrate 20, an active region 10, an element region 30, an edge termination structure 50, a gate pad 70, a source pad 72, an interconnection 73, a covered region 78, a cathode pad 74 and an anode pad 76. Note that FIG. 1 does not show a protection film 14 of the semiconductor device 100 positioned at the outmost position in the z direction. As described later, the protection film 14 is positioned at the outmost position in the z direction in the semiconductor device 100 except for the front surfaces of the gate pad 70, the source pad 72, the cathode pad 74 and the anode pad 76, which are electrically connected to external electrodes.

The active region 10 has therein a gate structure 12, which is described later, and the like. In the present example, the active region 10 is a vertical metal oxide semiconductor field effect transistor (MOSFET) but may be an insulated gate bipolar transistor (IGBT). The front surface of the active region 10 is entirely covered with a barrier layer 40, which is described later. Note that the barrier layer 40 are indicated by the shaded portions in FIG. 1.

The gate pad 70 is a portion that can provide electrical connection between a gate electrode, which is described later, and an electrode external to the semiconductor device 100. Likewise, the source pad 72 is a portion that can provide electrical connection between a source electrode, which is described later, and an electrode external to the semiconductor device 100. In the present example, the gate pad 70 and the source pad 72 may be formed by the barrier layer 40, which is described later, and electrodes containing Al positioned on the front surface of the barrier layer 40.

The element region 30 is a different region than the active region 10. The front surface of the element region 30 is covered with the barrier layer 40, which is described later. The element region 30 may include a temperature measuring element designed to measure the temperature of the semiconductor device 100. The cathode pad 74 and the anode pad 76 are portions electrically connected to the cathode and the anode of the temperature measuring element. The cathode pad 74 provides electrical connection between the cathode of the temperature measuring element and an external electrode, and the anode pad 76 provides electrical connection between the anode of the temperature measuring element and an external electrode.

The cathode pad 74 and the cathode of the element region 30 are electrically connected via the interconnection 73. In addition, the anode pad 76 and the anode of element region 30 are electrically connected via the interconnection 73. In the present example, the interconnection 73 is formed by the barrier layer 40, which is described later, and an electrode containing Al provided on the front surface of the barrier layer 40.

The edge termination structure 50 extends along the edges of the semiconductor substrate 20. The front surface of the edge termination structure 50 is covered with the barrier layer 40, which is described later. The edge termination structure 50 includes a plurality of guard rings extending along the edges of the semiconductor substrate 20. The guard rings, which are described later, are designed to expand the depletion layer generated in the semiconductor substrate 20 in the active region 10 to reach the edges of the semiconductor substrate 20. This can prevent the electric field concentration caused by the depletion layer in the semiconductor substrate 20. Accordingly, the semiconductor device 100 can achieve improved breakdown voltage than when the edge termination structure 50 is not provided.

The covered region 78 is a region in which the barrier layer 40, which is described later, is provided on the front surface of the semiconductor substrate 20. Between the covered region 78 and the semiconductor substrate 20, an insulating film such as an interlayer insulating film that is formed during the manufacturing process may be provided. The covered region 78 is provided as a result of covering the front surface of the semiconductor substrate 20 in the region in which the active region 10, the element region 30 and the like are not provided as much as possible with the barrier layer 40, which is described later. Thus, the barrier layer 40, which is described later, covers a larger region than the active region 10, the element region 30 and the like.

Figure 2:
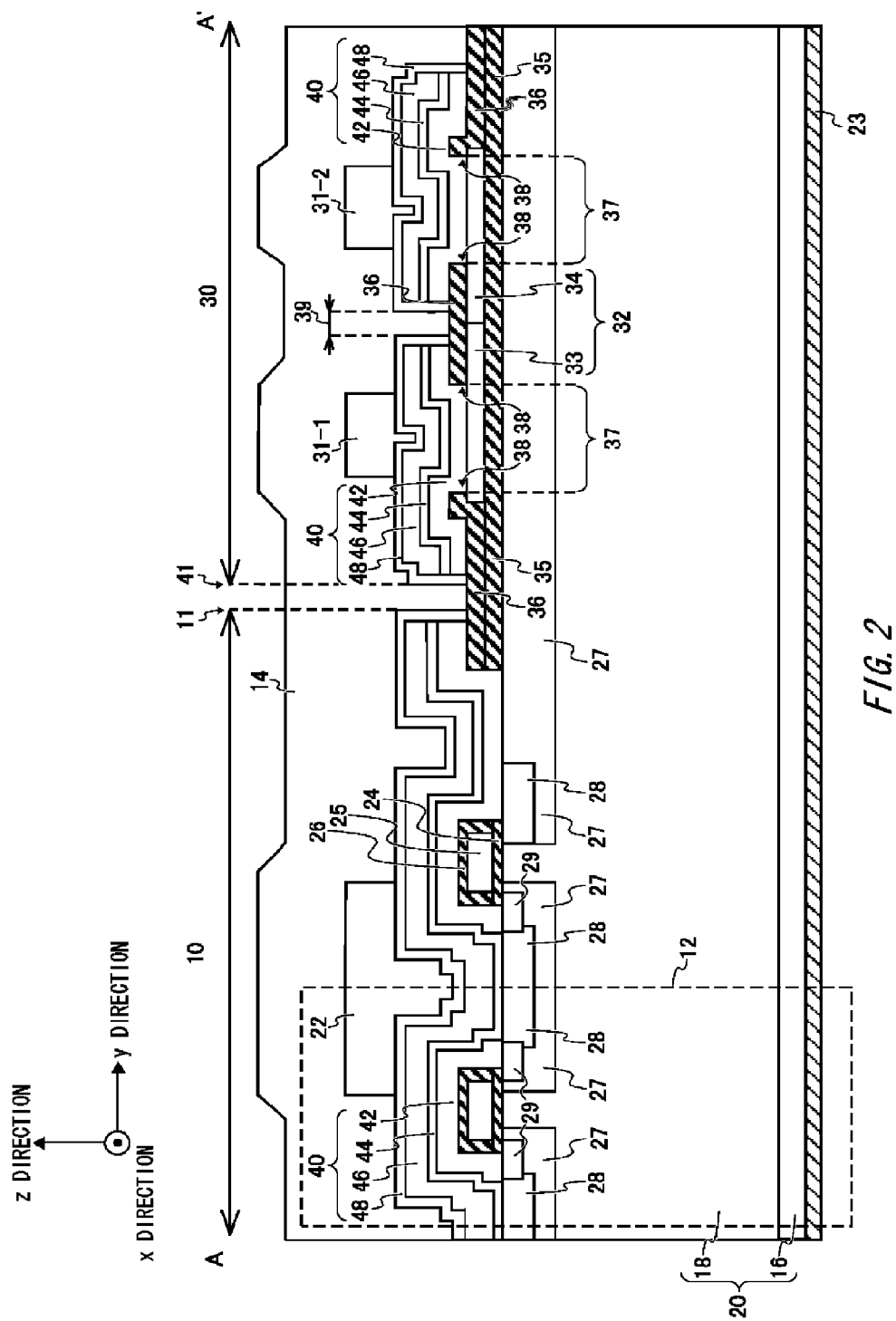
FIG. 2 shows a cross-section along A-A' indicated in FIG. 1.

FIG. 2 shows a cross-section along A-A' indicated in FIG. 1. The cross-section along A-A' is obtained by cutting the region including the active region 10 and the element region 30 along the y-z plane. In the present example, the semiconductor device 100 includes a vertical MOSFET. In the present example, the semiconductor substrate 20 is made of silicon carbide (SiC), but the semiconductor substrate 20 may be made of gallium nitride (GaN) or silicon (Si).

In the present example, the semiconductor substrate 20 includes a $n^+$-type layer 16 and an n-type drift layer 18 formed on the front surface of the $n^+$-type layer 16. The $n^+$-type layer 16 may be an $n^+$-type SiC substrate, and the n-type drift layer 18 may be a SiC layer epitaxially formed on the front surface of the $n^+$-type SiC substrate. On the back surface of the semiconductor substrate 20, the drain electrode 23 is provided.

(Active Region 10)

The active region 10 includes a plurality of gate structures 12. The gate structures 12 in the active region 10 each include a gate insulating film 24, a gate electrode 25, an interlayer insulating film 26, a barrier layer 40, a source electrode 22, a drain electrode 23, a p-type well region 27, a $p^+$-type contact region 28, and a $n^+$-type source region 29.

The gate insulating film 24, the gate electrode 25 and the interlayer insulating film 26 are provided in the stated order with the gate insulating film 24 being positioned closest to the n-type drift layer 18. The interlayer insulating film 26 is provided between the gate electrode 25 and the source electrode 22, which is positioned more outside in the z direction than the gate electrode 25 is. In addition, the interlayer insulating film 26 surrounds the side surfaces of the gate electrode 25. When a predetermined voltage is applied to the gate electrode 25, a channel is formed in the p-type well region 27 directly below the gate electrode 25 to allow electrical conduction between the n$^+$-type source region 29 and the n-type drift layer 18.

The source electrode 22 is an electrode containing Al provided on the front surface of the semiconductor substrate 20. The source electrode 22 is electrically connected to the p$^+$-type contact region 28 and the n$^+$-type source region 29 via the barrier layer 40. The barrier layer 40 is provided between the semiconductor substrate 20 and the source electrode 22. To be more specific, the barrier layer 40 is provided on the entire front surface of the active region 10 between the source electrode 22 and the interlayer insulating film 26. The barrier layer 40 includes a first titanium nitride layer 42, a first titanium layer 44, a second titanium nitride layer 46 and a second titanium layer 48, which are arranged in the stated order with the first titanium nitride layer 42 being positioned closest to the semiconductor substrate 20.

The first titanium nitride layer 42 is provided to prevent the structures on the back surface of the first titanium nitride layer 42 from reacting with the first titanium layer 44. The first titanium layer 44 serves as a hydrogen barrier layer to block entrance and exit of hydrogen. The second titanium nitride layer 46 is capable of preventing the source electrode 22 containing Al provided on the front surface of the barrier layer 40 from reacting with the first titanium layer 44.

The second titanium layer 48 reacts with the source electrode 22 containing Al to form a Ti—Al layer that has a higher hardness than a single Al layer. In addition, when not reacting with the Al contained in the source electrode 22, the second titanium layer 48, serves as a hydrogen barrier layer to block entrance and exit of hydrogen. The second titanium layer 48 may have a larger thickness than the first titanium layer 44 in order to keep the hydrogen barrier capability even if it forms the Ti—Al layer. As used herein, the thickness of the second titanium layer 48 includes the thickness of the Al—Ti alloy layer observed after the formation of the source electrode 22 containing Al.

The first titanium layer 44 and the second titanium layer 48 may each have a smaller thickness than either of the first titanium nitride layer 42 and the second titanium nitride layer 46. Since the titanium layers have a higher stress than the titanium nitride layers, the stress generated in the semiconductor device 100 can be reduced by forming the titanium layers more thinly than the titanium nitride layers.

In the present example, the first titanium layer 44 and the second titanium layer 48 each have a thickness of no less than 10 nm and no more than 50 nm, and the first titanium nitride layer 42 and the second titanium nitride layer 46 each have a thickness of no less than 50 nm and no more than 200 nm. The lower limit of the thicknesses of the titanium layers and the titanium nitride layers may be the minimum value that does not cause their disconnection in the step portions. Since the stress generated in the semiconductor device 100 increases as the thicknesses of the titanium layers and the titanium nitride layers increase, the upper limit of the thicknesses of the titanium layers and the titanium nitride layers may be the maximum value that can regulate the stress generated in the semiconductor device 100.

(Element Region 30)

The element region 30 includes an insulating film 35 in contact with the front surface of the semiconductor substrate 20, a semiconductor element in contact with the insulating film 35, and an interlayer insulating film 36 on the front surface of the semiconductor element. The interlayer insulating film 36 is also in contact with the insulating film 35. The insulating film 35 and the interlayer insulating film 36 extend from the active region 10 to the element region 30.

In the present example, the semiconductor element is a pn-junction diode 32. The pn-junction diode 32 includes an n-type semiconductor region 33 and a p-type semiconductor region 34. The n-type semiconductor region 33 may be made of n-type polysilicon, and the p-type semiconductor region 34 may be made of p-type polysilicon. The n-type semiconductor region 33 and the p-type semiconductor region 34 may have nickel silicide (NiSi) on the interfaces connected with the barrier layer 40 in order to lower the contact resistance.

The pn-junction diode 32 is used to detect how much the semiconductor substrate 20 is overheated. The semiconductor device 100 may be connected to a controller IC, which is electrically connected to the gate structures 12 in the active region 10. The controller IC lowers the temperature of the semiconductor substrate 20 by lowering the operational frequency of the active region 10 when the temperature of the semiconductor substrate 20, which is measured by the pn-junction diode 32 exceeds a predetermined temperature. This can prevent the semiconductor device 100 from being abnormally overheated.

The interlayer insulating film 36 has therein a contact hole 37. In the contact hole 37, the barrier layer 40 is provided. The pn-junction diode 32 and the electrode 31 containing Al are electrically connected to each other via the barrier layer 40 in the contact hole 37. The barrier layer 40 also covers the side walls 38 of the contact hole 37.

The barrier layer 40 is positioned between the electrode 31 and the pn-junction diode 32. The barrier layer 40 in the element region 30 is manufactured in the same step as the barrier layer 40 in the active region 10. In other words, the barrier layer 40 in the element region 30 and the barrier layer 40 in the active region 10 are made of the same material and their component layers are stacked in the same order.

The barrier layer 40 in the element region 30 has the same capabilities as the barrier layer 40 in the active region 10. Note that, in the element region 30, the first titanium nitride layer 42 is also capable of preventing the NiSi layer on the front surface of the n-type semiconductor region 33 and the p-type semiconductor region 34 from reacting with the first titanium layer 44.

The barrier layer 40 covers the front surface of the pn-junction diode 32. In order to electrically separate the barrier layer 40 connected to the n-type semiconductor region 33 (cathode) and the barrier layer 40 connected to the p-type semiconductor region 34 (anode) from each other, a gap 39 is provided between the barrier layer 40 provided on the front surface of the n-type semiconductor region 33 and the barrier layer 40 provided on the front surface of the p-type semiconductor region 34. The length of the gap 39 in the y direction may be 10 μm.

The barrier layer 40 occupies as large an area as possible on the front surface of the element region 30 provided that the barrier layer 40 can electrically separate the anode and the cathode from each other. In this way, the barrier layer 40 can be formed without the disconnection of the titanium layers in the step portions, reduce the stress generated in the semiconductor device 100 and block entrance and exit of hydrogen.

An electrode 31-1 is provided on the front surface of the barrier layer 40 connected to the n-type semiconductor region 33, and an electrode 31-2 is provided on the front surface of the barrier layer 40 connected to the p-type semiconductor region 34. The electrode 31-1 is electrically connected to the cathode pad 74 shown in FIG. 1, and the electrode 31-2 is electrically connected to the anode pad 76 shown in FIG. 1. The principle of sensing the temperature using the pn-junction diode 32 is not described herein. The principle similar to the principle disclosed in the above-described Japanese Patent Application Publication 2013-201357 may be employed.

(Boundary Region between Active Region 10 and Element Region 30)

The barrier layer 40 also covers the front surface of the insulating film 35 that extends from the active region 10 to the element region 30 and the front surface of the interlayer insulating film 36. Here, an end 11 denotes the end of the barrier layer 40 that extends toward the element region 30. The end 11 of the barrier layer 40 in the active region 10 that faces the element region 30 may be spaced away by no less than 10 μm and no more than 20 μm from an end 41 of the barrier layer 40 in the element region 30 that faces the active region 10. The gap of no less than 10 μm and no more than 20 μm is provided in the barrier layer 40 in order to electrically disconnect the active region 10 and the element region 30 from each other. In the present example, the barrier layer 40 is also provided in the boundary region between the active region 10 and the element region 30. Accordingly, the hydrogen can be also blocked from entering and exiting through the boundary region.

(Semiconductor Device 100 as a Whole)

A protection film 14 covers the active region 10 and the element region 30 and is provided on the front surfaces of the barrier layer 40, the source electrode 22 and the electrode 31. The protection film 14 may be capable of preventing the electric discharging. In the present example, the barrier layer 40 covers not only the active region 10, the element region 30 and the edge termination structure 50, but also the region in which the active region 10 and the like are not provided (e.g., the covered region 78). In other words, the barrier layer 40 covers as much of the entire front surface of the semiconductor device 100 as possible. This can prevent the hydrogen from entering the gate insulating film 24 and thus solve the problem of the shift in the gate voltage threshold (Vth) of the gate structure 12.

Figure 3:
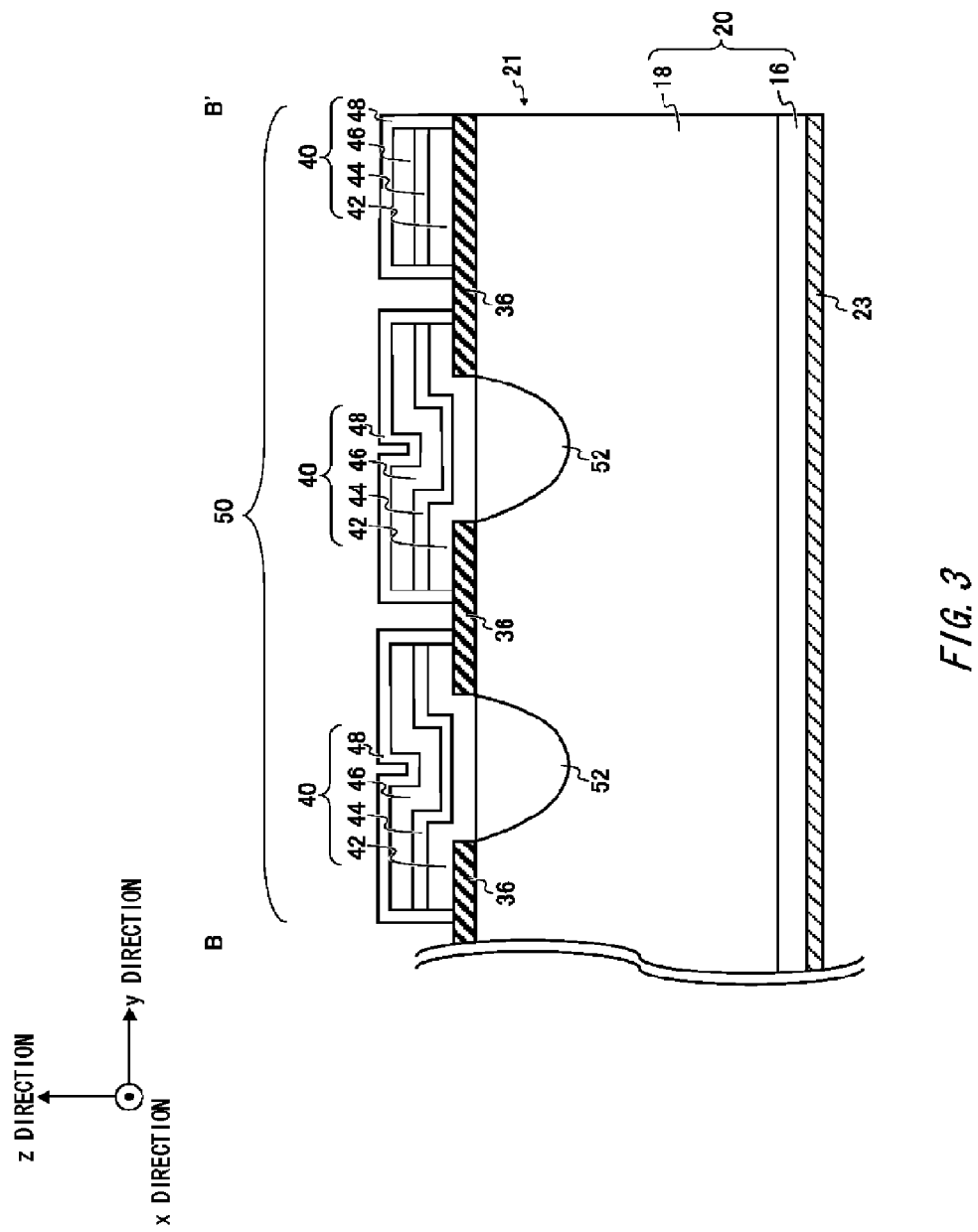
FIG. 3 shows a cross-section along B-B' indicated in FIG. 1.

FIG. 3 shows a cross-section along B-B' indicated in FIG. 1. The cross-section along B-B' is a cross-section of the edge termination structure 50 along the y-z plane. The edge termination structure 50 includes guard rings 52, an interlayer insulating film 36 and a barrier layer 40. FIG. 3 only shows two guard rings 52, but three or more guard rings 52 may be alternatively provided.

The guard rings 52 may be each a p-type semiconductor region formed in the n-type drift layer 18 on the front surface side thereof. The p-type semiconductor region provided by the guard ring 52 and the n-type drift layer 18 form a pn junction. In the edge termination structure 50, the interlayer insulating film 36 is provided in the portion excluding the front surfaces of the guard rings 52.

The edge termination structure 50 includes a barrier layer 40. The barrier layer 40 in the edge termination structure 50 is manufactured in the same step as the barrier layer 40 in the active region 10. Accordingly, the barrier layer 40 in the edge termination structure 50 and the barrier layer 40 in the active region 10 are made of the same material and their component layers are stacked in the same order.

Since the barrier layer 40 in the edge termination structure 50 does not provide external electrical connection, no Al-containing electrodes may be provided on the front surface of the barrier layer 40 in the edge termination structure 50. As a result, a reduced amount of hydrogen may be provided by the aluminum. Regarding the barrier layer 40 of the present example, the second titanium layer 48 that is positioned at the outmost position in the z direction covers the side surfaces of the ends of the first titanium nitride layer 42, the first titanium layer 44 and the second titanium nitride layer 46. In this way, the titanium nitride layers, which may be more easily corroded by acid and the like than the titanium layers, can be protected by the second titanium layer 48.

On the front surface of the edge termination structure 50, a plurality of barrier layers 40 are provided and have a floating potential. The barrier layers 40 are each formed like a rectangular ring, like the guard rings 52. The barrier layers 40 are electrically connected to the guard rings 52. The barrier layers 40, which are provided on the guard rings 52 in a one-to-one correspondence, are spaced away from each other. Here, the barrier layer 40 that is the closest to the edge 21 of the substrate is also shaped as a rectangular ring. Note that no guard ring 52 is provided to face the back surface of the barrier layer 40 that is the closest to the edge 21 of the substrate.

FIGS. 4A to 4F show a method of manufacturing the active region 10 and the element region 30 of the semiconductor device 100. In the present example, the semiconductor device 100 may have a breakdown voltage of 1,200 V class. FIGS. 4A to 4F show an exemplary method of manufacturing the semiconductor device 100, in which the impurity concentrations, the thermal treatment temperatures, the thermal treatment durations, the layer or film thicknesses and the like may be changed as needed.

Figure 4A:
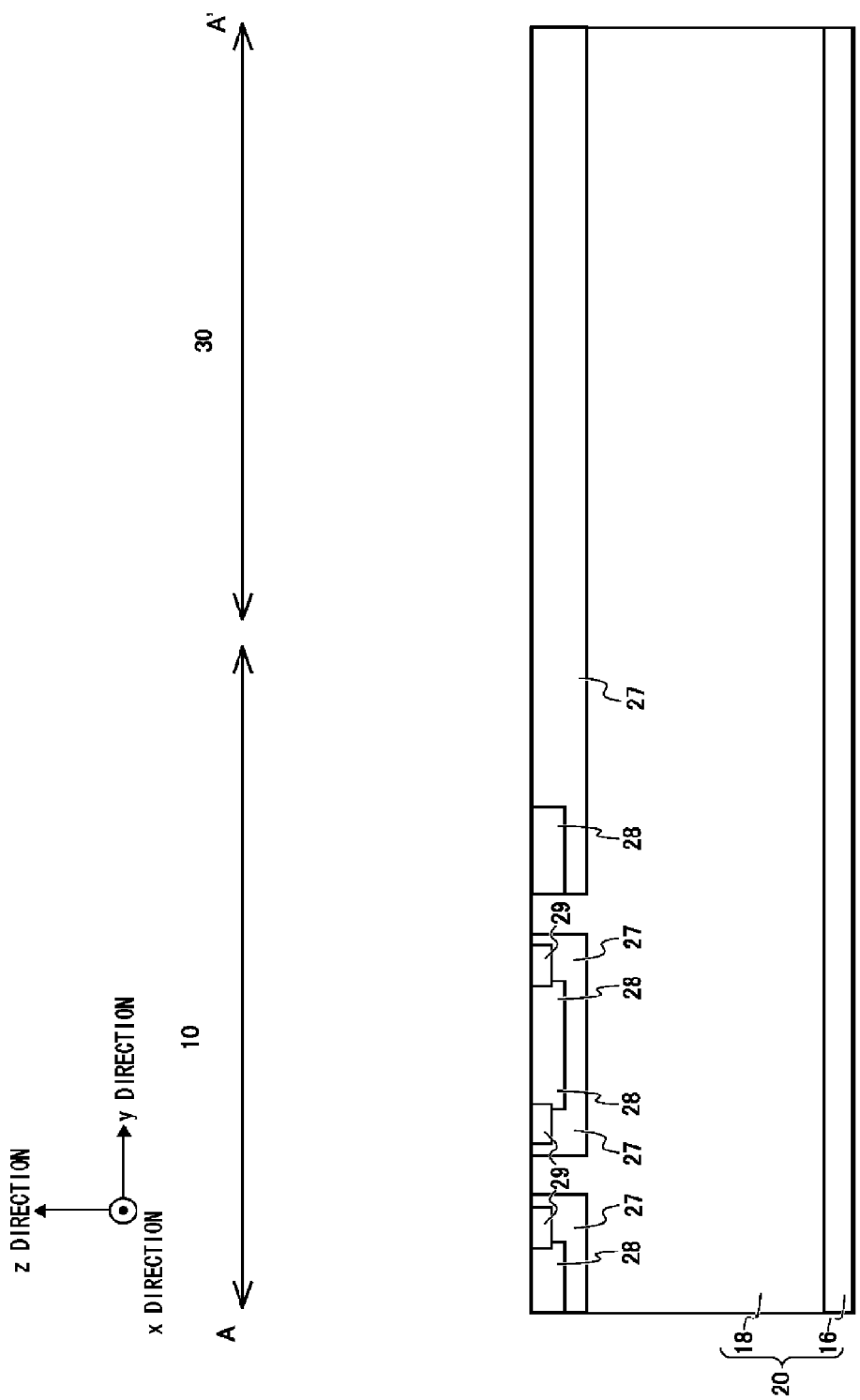
FIG. 4A shows a step of forming a p-type well region 27, a p$^+$-type contact region 28, and an n$^+$-type source region 29.

FIG. 4A shows the step of forming the p-type well region 27, the p$^+$-type contact region 28 and the n$^+$-type source region 29. To start which, an n$^+$-type layer 16 is provided that has an n-type impurity concentration of approximately 2.0E+19 cm$^{-3}$. Here, the letter "E" means powers of 10. For example, "E+19" means 10 raised to the power of 19. In the present example, the n$^+$-type layer 16 is an n$^+$-type SiC substrate. The main plane of the n$^+$-type SiC substrate may be the (000-1) plane that has an off angle of approximately 4 degrees in the <11-20> direction.

Subsequently, on the front surface of the n$^+$-type layer 16, an n-type drift layer 18 having an n-type impurity concentration of approximately 1.0E+16 cm$^{-3}$ is epitaxially grown to have a thickness of approximately 10 μm. In the present example, the n-type impurity concentration means the nitrogen (N) concentration, but any other types of n-type impurities may be used.

After this, on the front surface of the n-type drift layer 18, the p-type well region 27 having a p-type impurity concentration of approximately 2.0E+16 cm$^{-3}$ is epitaxially grown to have a thickness of approximately 0.5 μm. In the present example, the p-type impurity concentration means the Al concentration, but any other types of p-type impurities may be used. Note that, in the region in which the p-type well region 27 is not formed, the n-type drift layer 18 is further epitaxially grown to have an additional thickness of approximately 0.5 μm.

Following this, photolithography and ion implantation are performed to selectively form the p$^+$-type contact region 28 in the p-type well region 27 on the front surface thereof. Note that this step simultaneously forms the guard rings 52. Subsequently, photolithography and ion implantation are performed to selectively form the n$^+$-type source region 29 in the p-type well region 27 on the front surface thereof.

After this, the semiconductor substrate 20 is thermally treated in order to activate the p-type well region 27, the p+-type contact region 28, the guard rings 52 and the n+-type source region 29. For example, the semiconductor substrate 20 is thermally treated for approximately two minutes at 1,620° C.

Figure 4B:
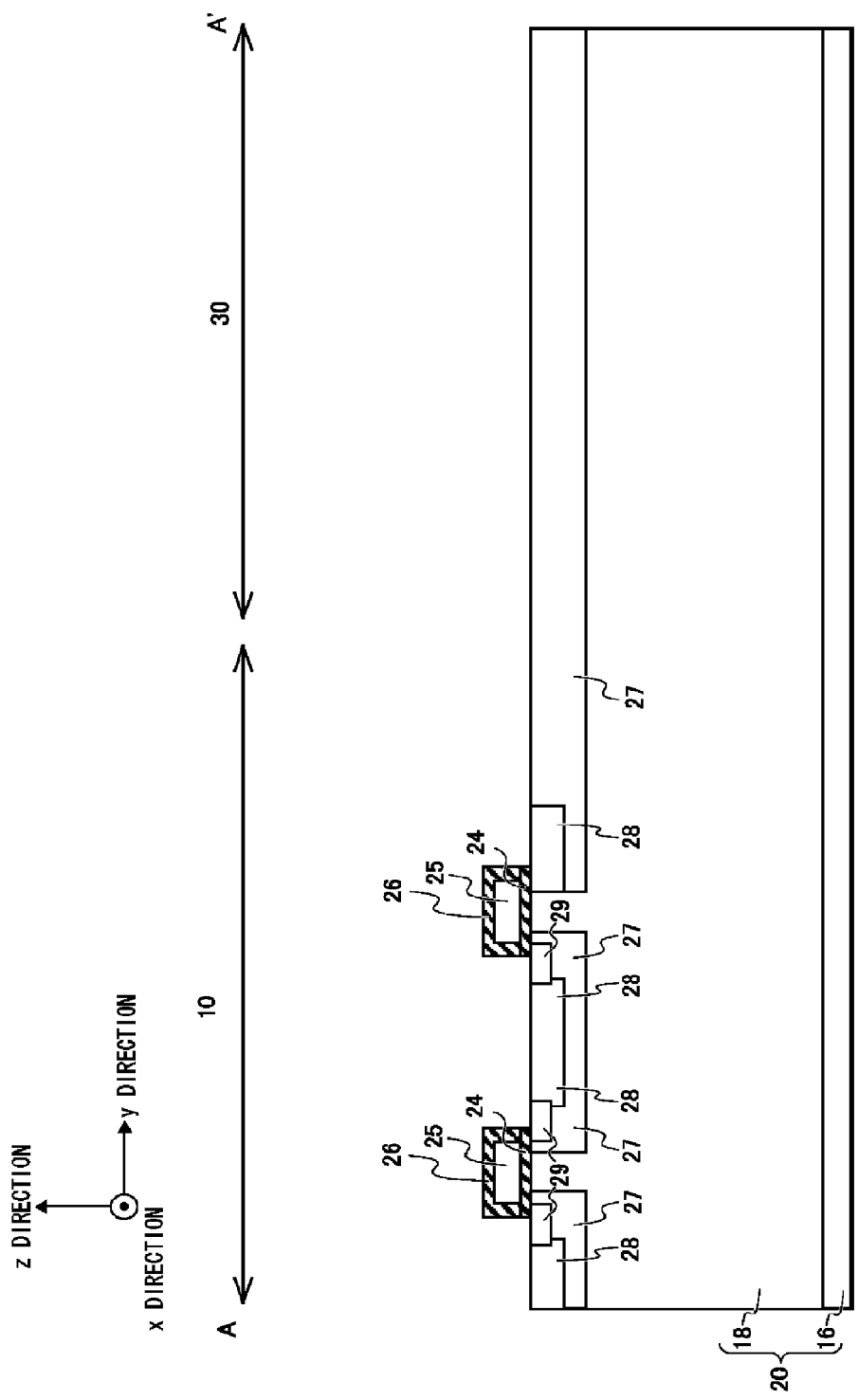
FIG. 4B shows a step of forming a gate insulating film 24, a gate electrode 25 and an interlayer insulating film 26.

FIG. 4B shows the step of forming the gate insulating film 24, the gate electrode 25 and the interlayer insulating film 26. FIG. 4B shows the step subsequent to the step shown in FIG. 4A. In the step shown in FIG. 4B, to start with, the semiconductor substrate 20 is exposed to the temperature of approximately 1,000° C. in the mixed atmosphere of oxygen and hydrogen to be thermally oxidized. In this way, the gate insulating film 24 is formed. The gate insulating film 24 may have a thickness of approximately 100 nm. As a result, the gate insulating film 24 covers the front surface of the semiconductor substrate 20.

Following this, on the front surface of the gate insulating film 24, polycrystalline silicon doped with phosphorous is formed. Subsequently, photolithography is performed to selectively remove the polycrystalline silicon to leave the polycrystalline silicon in the region sandwiched between two p-type well regions 27. As a result, the polycrystalline silicon provides the gate electrode 25. After this, the interlayer insulating film 26 is formed on the front and side surfaces of the gate electrode 25. Following this, photolithography is performed to pattern the gate insulating film 24 and the interlayer insulating film 36 to leave the gate insulating film 24 directly below the gate electrode 25 and to leave the interlayer insulating film 36 on the front and side surfaces of the gate electrode 25. The p-type well region 27 directly below the gate electrode 25 serves as a channel forming region.

Figure 4C:
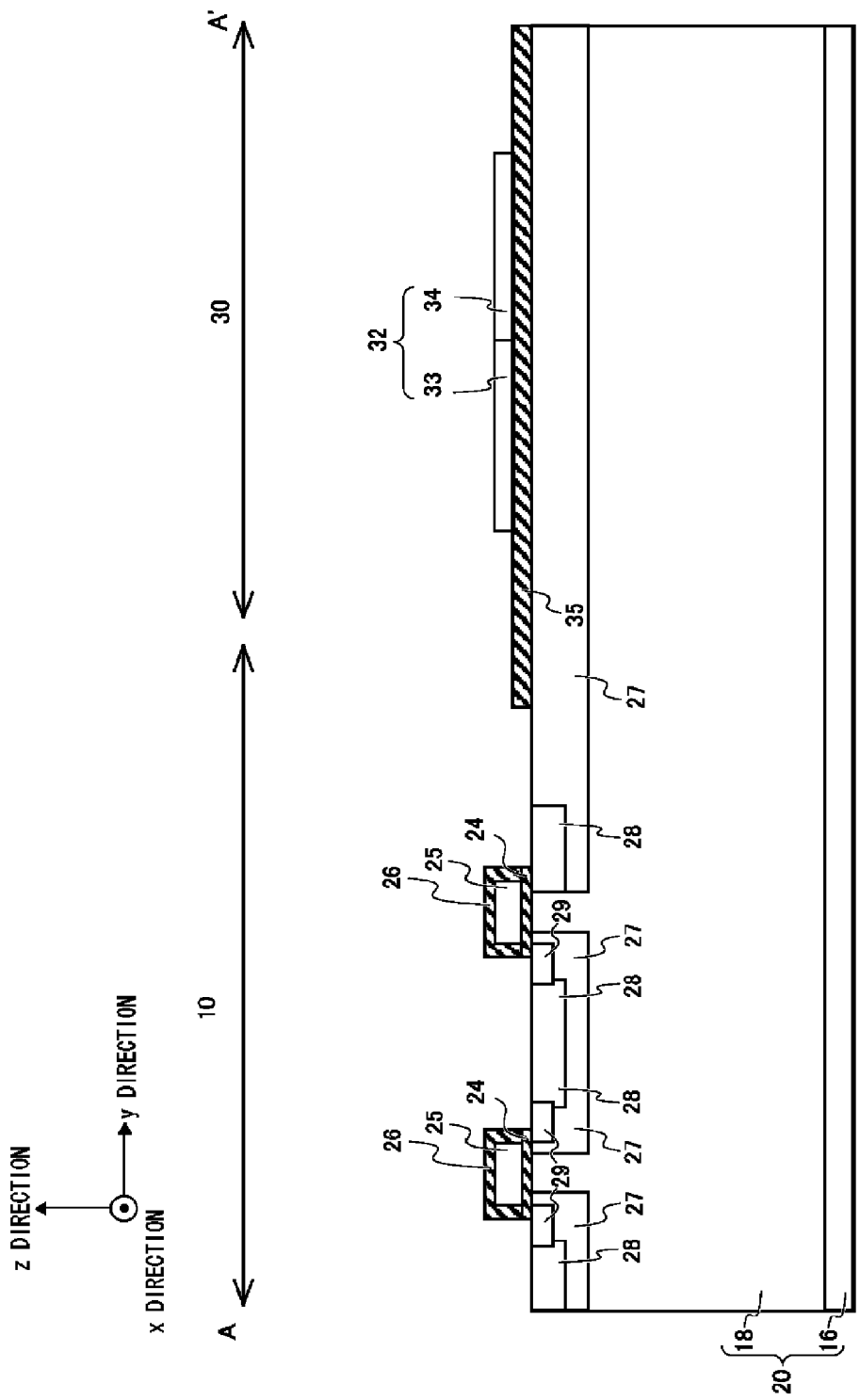
FIG. 4C shows a step of forming an insulating film 35 and a pn-junction diode 32.

FIG. 4C shows the step of forming the insulating film 35 and the pn-junction diode 32. FIG. 4C shows the step subsequent to the step shown in FIG. 4B. In the step shown in FIG. 4C, to start with, the insulating film 35 having a thickness of 2,000 angstroms or larger is provided on the front surface of the semiconductor substrate 20 in the region including the element region 30. The insulating film 35 is an oxide film, a phosphosilicate glass (PSG) film or a borophosphosilicate glass (BPSG) film. Photolithography may be employed to pattern the insulating film 35. As a result, the insulating film 35 is formed in the vicinity of the boundary between the active region 10 and the element region 30 and in the element region 30.

Subsequently, in the element region 30, the n-type semiconductor region 33 and the p-type semiconductor region 34 made of polycrystalline silicon are formed. The n-type semiconductor region 33 and the p-type semiconductor region 34 may be formed by performing ion implantation on the non-doped polycrystalline silicon, or by selectively growing n-type polycrystalline silicon and p-type polycrystalline silicon. The n-type and p-type impurities for the non-doped polycrystalline silicon may be respectively boron (B) or the like and arsenide (As) or the like. Since the pn-junction diode 32 is formed after the steps shown in FIGS. 4A and 4B, the pn-junction diode 32, which is made of polycrystalline silicon, can be prevented from being exposed to high temperature treatment exceeding 1,000° C. This can prevent the polycrystalline silicon from being damaged.

Figure 4D:
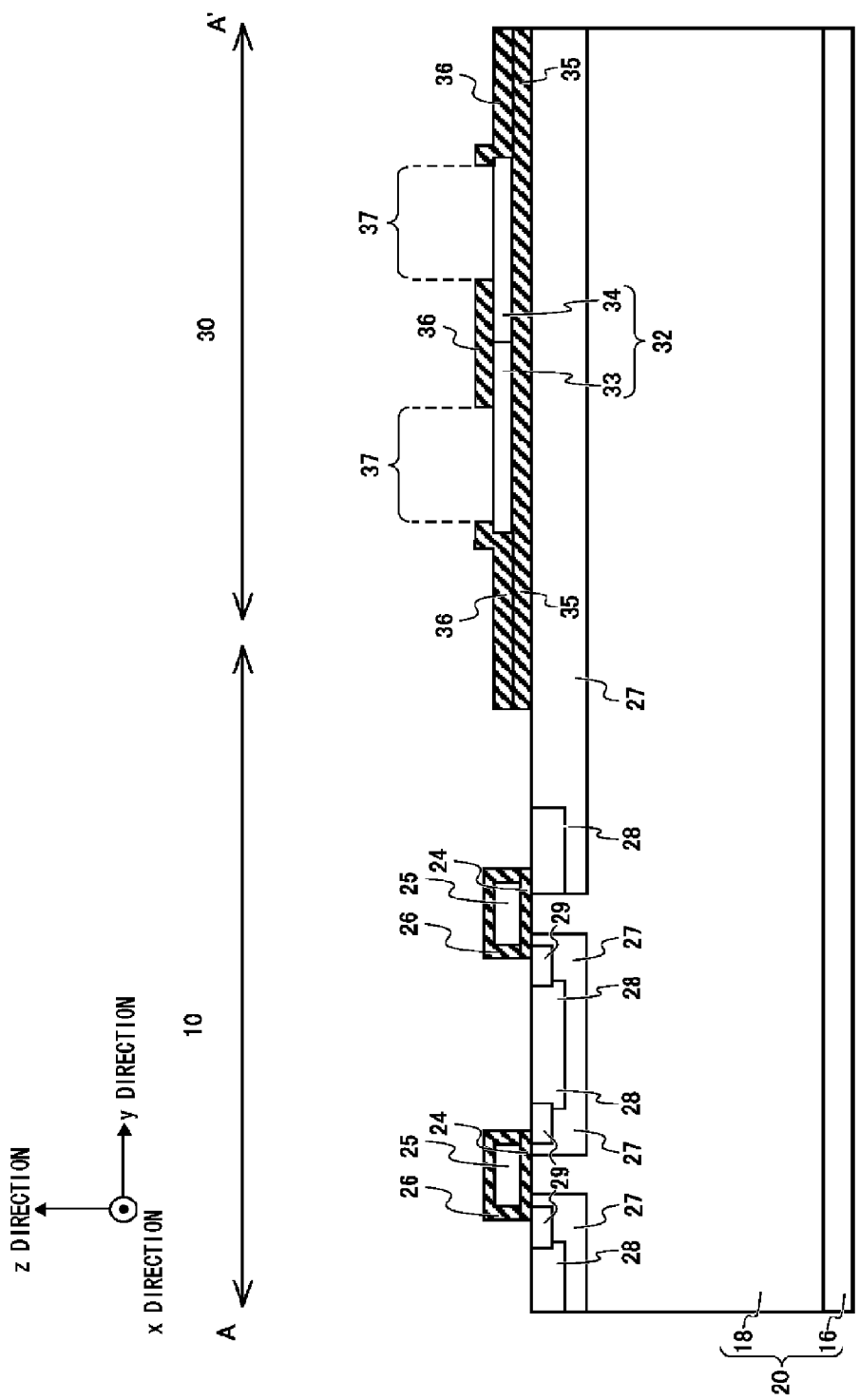
FIG. 4D shows a step of forming an interlayer insulating film 36.

FIG. 4D shows the step of forming the interlayer insulating film 36. FIG. 4D shows the step subsequent to the step shown in FIG. 4C. In the step shown in FIG. 4D, to start with, the interlayer insulating film 36 is formed on the front surface of the semiconductor substrate 20 in the region including the element region 30. Photolithography is performed to pattern the interlayer insulating film 36 in the element region 30 in order to form the contact holes 37 on the front surface of the n-type semiconductor region 33 and on the front surface of the p-type semiconductor region 34. After this, the semiconductor substrate 20 is thermally treated, to reflow and thus flatten the interlayer insulating film 36.

Figure 4E:
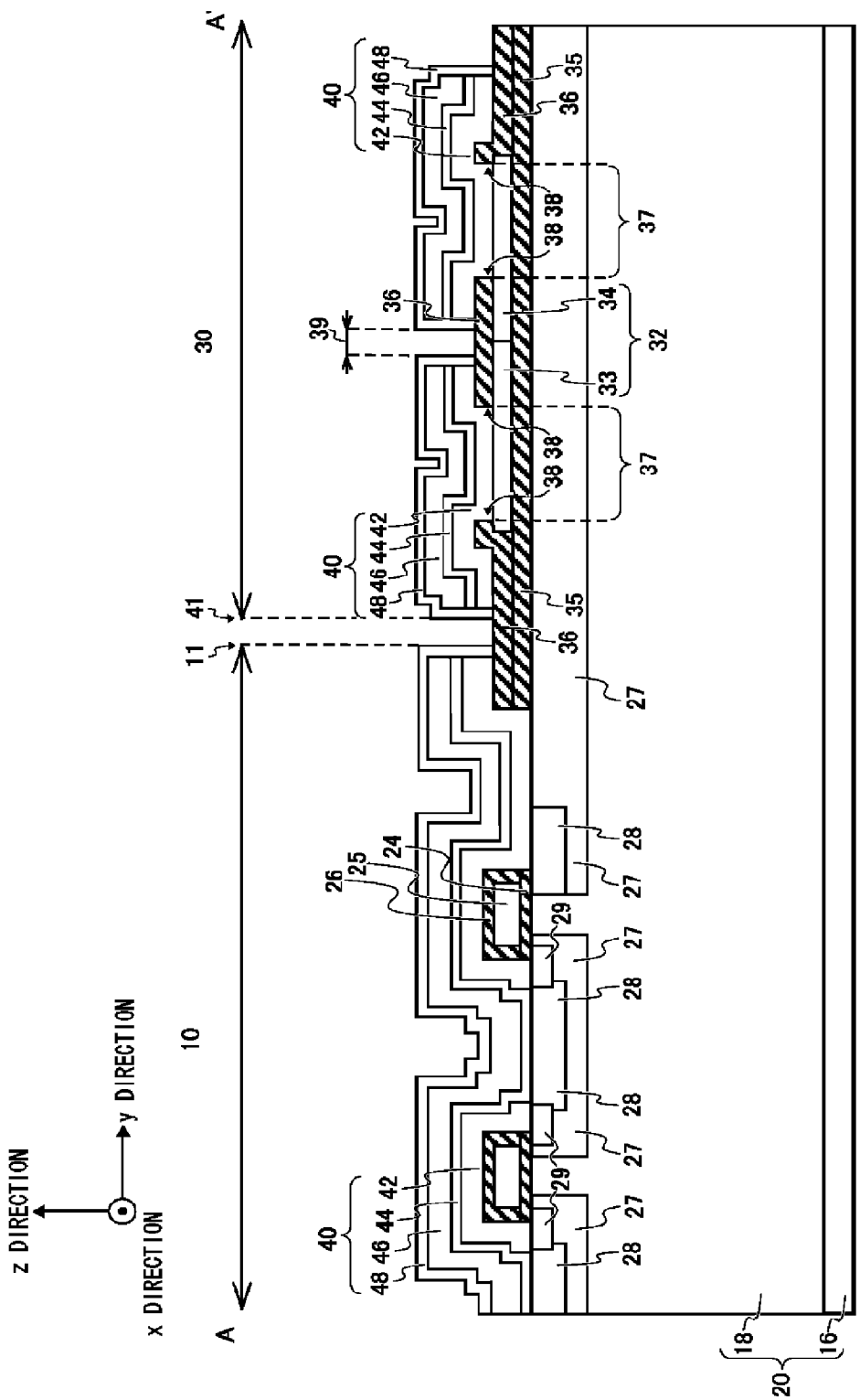
FIG. 4E shows a step of forming a barrier layer 40.

FIG. 4E shows the step of forming the barrier layer 40. FIG. 4E shows the step subsequent to the step shown in FIG. 4D. In the step shown in FIG. 4E, to start with, sputtering is performed to sequentially deposit the first titanium nitride layer 42, the first titanium layer 44, and the second titanium nitride layer 46. Accordingly, the first titanium nitride layer 42 is physically in contact with the p+-type contact region 28 and the n+-type source region 29. As described above, the first titanium layer 44 may have a thickness of no less than 10 nm and no more than 50 nm, and the first titanium nitride layer 42 and the second titanium nitride layer 46 may each have a thickness of no less than 50 nm and no more than 200 nm. Following this, photolithography is performed to pattern the first titanium nitride layer 42, the first titanium layer 44 and the second titanium nitride layer 46, so that the first titanium nitride layer 42, the first titanium layer 44 and the second titanium nitride layer 46 are divided into separate portions respectively positioned in the active region 10, in the n-type semiconductor region 33 in the element region 30, and in the p-type semiconductor region 34 in the element region 30.

Subsequently, sputtering is performed to deposit the second titanium layer 48. The second titanium layer may have a thickness of no less than 10 nm and no more than 50 nm. In the present example, the second titanium layer 48 covers the side surfaces of the ends of the first titanium nitride layer 42, the first titanium layer 44 and the second titanium nitride layer 46, which are aligned with each other in the z direction as a result of the patterning. After this, the second titanium layer 48 is patterned. As a result, the end 11 of the barrier layer 40 in the active region 10 is spaced away by no less than 10 μm and no more than 20 μm from the end 41 of the barrier layer 40 in the element region 30. Simultaneously, a gap 39 is provided between the barrier layer 40 connected to the n-type semiconductor region 33 and the barrier layer 40 connected to the p-type semiconductor region 34. As described above, the gap 39 may be 10 μm.

Figure 4F:
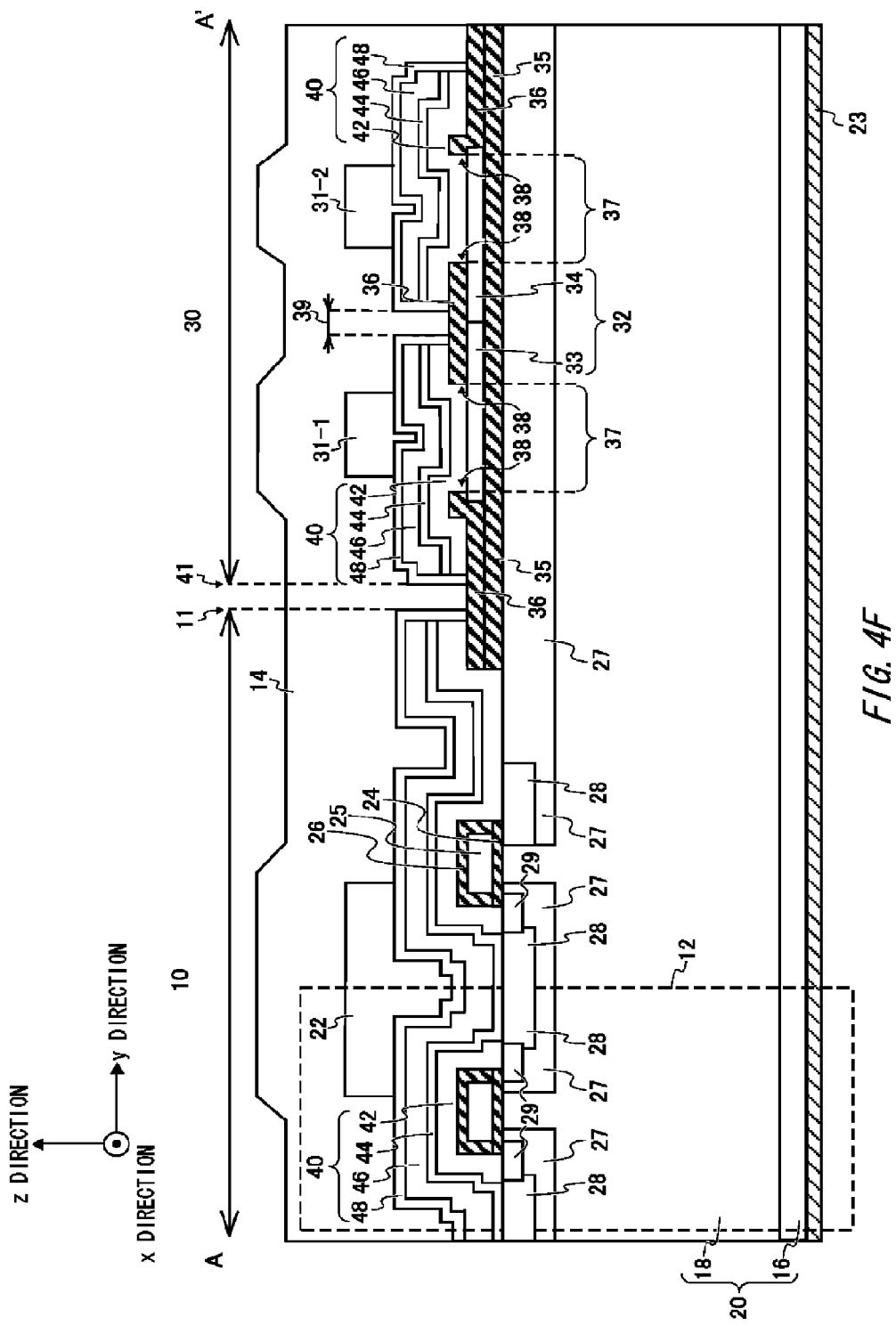
FIG. 4F shows a step of forming a source electrode 22, an electrode 31, a protection film 14 and a drain electrode 23.

FIG. 4F shows the step of forming the source electrode 22, the electrode 31, the protection film 14 and the drain electrode 23. FIG. 4F shows the step subsequent to the step shown in FIG. 4E. Note that FIGS. 4F and 1 show the same structure. In the step shown in FIG. 4F, to start with, an Al layer is deposited by sputtering and patterned by photolithography, so that the source electrode 22 and the electrode 31 are formed. Following this, nickel (Ni) is deposited by sputtering on the back surface of the semiconductor substrate 20 and thermally treated at 970° C. As a result, an ohmic contact region is formed on the back surface of the n+-type layer 16. Subsequently, on the back surface of the ohmic contact region, Ni, Ti and gold (Au) are deposited in the stated order by sputtering. In this manner, the drain electrode 23 is formed.

Figure 5:
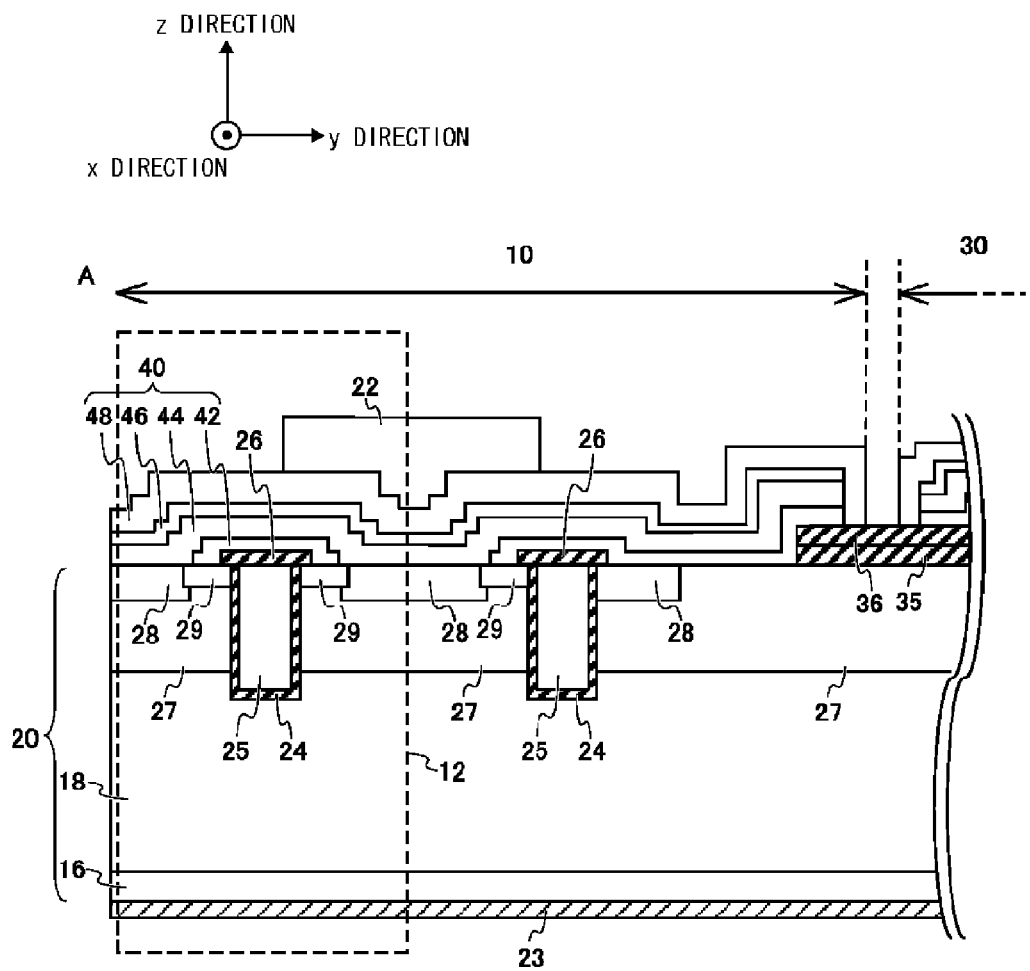
FIG. 5 shows an active region 10 relating to a second embodiment.

FIG. 5 shows an active region 10 relating to a second embodiment. In the present example, the gate structure 12 has a so-called trench gate electrode 25. The gate insulating film 24 covers the back and side surfaces of the gate electrode 25. The interlayer insulating film 26 covers the front surface of the gate electrode 25. In addition, the single p-type well region 27 is shared by a plurality of gate electrodes. In this regard, the second embodiment is different from the first embodiment. Except for this, the second embodiment is the same as the first embodiment.

In the present example, the gate electrode 25 penetrates through the p-type well region 27 to reach the n-type drift layer 18. When a predetermined voltage is applied to the gate electrode 25, a channel is formed between the gate insulating film 24 and the p-type well region 27, which electrically connects the n$^+$-type source region 29 and the n-type drift layer 18. In the present example, the barrier layer 40 can acquire the same capabilities and produce the same effects as in the first embodiment. Since the gate electrode 25 is a trench gate electrode, the gate structure 12 can be made smaller than in the first embodiment where the planar gate electrode is employed. Accordingly, the second embodiment can achieve improved channel density. In this manner, when compared with the case where the planar gate electrode is employed, the active region 10 can achieve a lowered on resistance.

Figure 6:
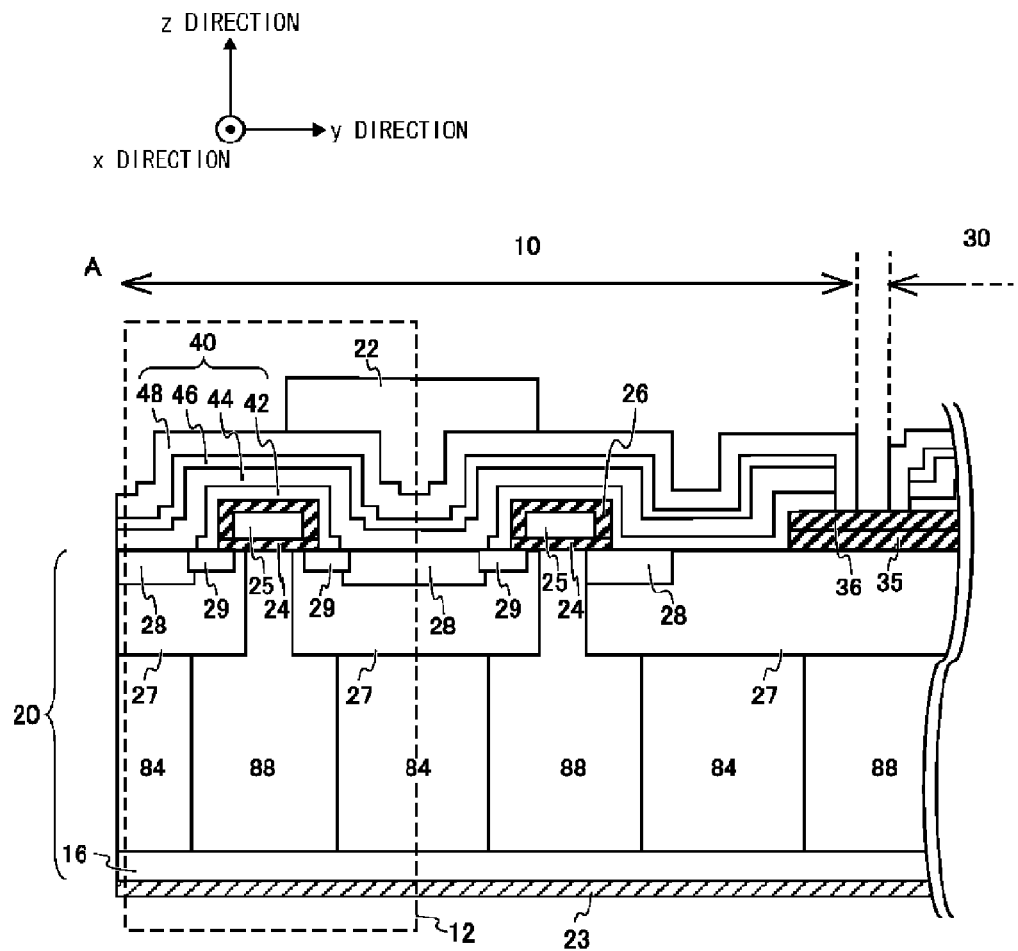
FIG. 6 shows an active region 10 relating to a third embodiment.

FIG. 6 shows an active region 10 relating to a third embodiment. In the present example, the active region 10 has a super junction structure in which p-type columns 84 and n-type columns 88 are periodically arranged. The p-type well region 27 and the p$^+$-type contact region 28 are provided on the front surfaces of the p-type columns 84. In addition, the gate insulating film 24 and the gate electrode 25 are provided on the front surfaces of the n-type columns 88. In these regards, the third embodiment is different from the first embodiment. Except for these, the third embodiment is the same as the first embodiment. In the present example, the barrier layer 40 can acquire the same capabilities and produce the same effects as in the first embodiment. By using the super junction structure in the active region 10, the impurity concentration of the n-type columns 88 can be higher than the impurity concentration of the n-type drift layer 18 relating to the first embodiment. As a result, the third embodiment can achieve a lower on resistance without sacrificing the breakdown voltage, when compared with the first embodiment.

Figure 7:
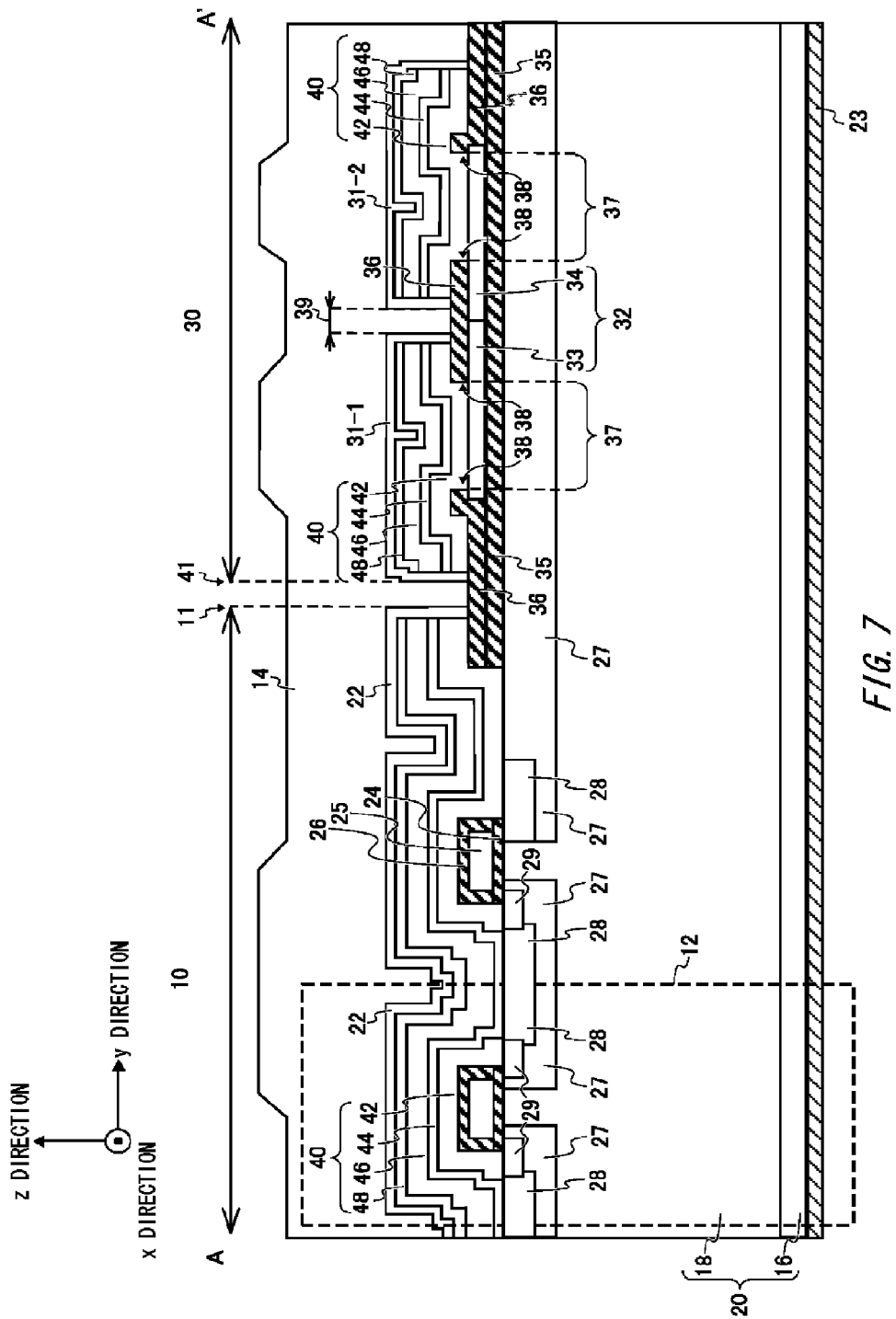
FIG. 7 shows an active region 10 relating to a fourth embodiment.

FIG. 7 shows an active region 10 relating to a fourth embodiment. In the present example, the source electrode 22 containing Al covers the side surfaces of the ends of the first titanium nitride layer 42, the first titanium layer 44, the second titanium nitride layer 46 and the second titanium layer 48, which are aligned with each other in the z direction as a result of the patterning. In this regard, the fourth embodiment is different from the first embodiment. Except for this, the fourth embodiment is the same as the first embodiment. With such a configuration, the titanium nitride layers, which are more likely to be corroded by acid and the like than the titanium layers, can be protected by the source electrode 22. Note that the source electrode 22 is in contact with the first titanium layer 44 only at the side surface of the end thereof. Therefore, no problems occur due to the reaction between the Al contained in the source electrode 22 and the first titanium layer 44.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

DESCRIPTION OF REFERENCE NUMERALS

10 . . . active region, 11 . . . end, 12 . . . gate structure, 14 . . . protection film, 16 . . . n$^+$-type layer, 18 . . . n-type drift layer, 20 . . . semiconductor substrate, 21 . . . substrate edge, 22 . . . source electrode, 23 . . . drain electrode, 24 . . . gate insulating film, 25 . . . gate electrode, 26 . . . interlayer insulating film, 27 . . . p-type well region, 28 . . . p$^+$-type contact region, 29 . . . n$^+$-type source region, 30 . . . element region, 31 . . . electrode, 32 . . . pn-junction diode, 33 . . . n-type semiconductor region, 34 . . . p-type semiconductor region, 35 . . . insulating film, 36 . . . interlayer insulating film, 37 . . . contact hole, 38 . . . side wall, 39 . . . gap, 40 . . . barrier layer, 41 . . . end, 42 . . . first titanium nitride layer, 44 . . . first titanium layer, 46 . . . second titanium nitride layer, 48 . . . second titanium layer, 50 . . . edge termination structure, 52 . . . guard ring, 70 . . . gate pad, 72 . . . source pad, 73 . . . interconnection, 74 . . . cathode pad, 76 . . . anode pad, 78 . . . covered region, 84 . . . p-type column, 88 . . . n-type column, 100 . . . semiconductor device

What is claimed is:

1. A semiconductor device comprising:
   a semiconductor substrate;
   an electrode provided on a front surface of the semiconductor substrate, the electrode containing aluminum;
   a gate electrode positioned between the semiconductor substrate and the electrode;
   an interlayer insulating film that covers a front surface of the gate electrode; and
   a barrier layer provided between the interlayer insulating film and the electrode, wherein
   the barrier layer includes a first titanium nitride layer, a first titanium layer, a second titanium nitride layer and a second titanium layer in the stated order with the first titanium nitride layer being positioned closest to the semiconductor substrate.

2. The semiconductor device as set forth in claim 1, wherein
   the second titanium layer has a larger thickness than the first titanium layer.

3. The semiconductor device as set forth in claim 1, wherein
   each of the first titanium layer and the second titanium layer has a smaller thickness than either of the first titanium nitride layer and the second titanium nitride layer.

4. The semiconductor device as set forth in claim 1, wherein
   each of the first titanium layer and the second titanium layer has a thickness of no less than 10 nm and no more than 50 nm, and
   each of the first titanium nitride layer and the second titanium nitride layer has a thickness of no less than 50 nm and no more than 200 nm.

5. The semiconductor device as set forth in claim 1, further comprising;
   an active region including the gate electrode; and
   an element region that is different from the active region and includes a semiconductor element provided on the front surface of the semiconductor substrate, wherein
   the barrier layer is provided between the electrode containing aluminum and the semiconductor element.

6. A semiconductor device comprising:
   a semiconductor substrate;
   an electrode provided on a front surface of the semiconductor substrate, the electrode containing aluminum;

a barrier layer provided between the semiconductor substrate and the electrode;
an active region including a gate structure; and
an element region that is different from the active region and includes a semiconductor element provided on the front surface of the semiconductor substrate, wherein
the barrier layer includes a first titanium nitride layer, a first titanium layer, a second titanium nitride layer and a second titanium layer in the stated order with the first titanium nitride layer being positioned closest to the semiconductor substrate,
the barrier layer is provided between the electrode containing aluminum and the semiconductor element,
the semiconductor element is a pn-junction diode, and
the electrode containing aluminum is an electrode electrically connected to the pn-j unction diode.

7. The semiconductor device as set forth in claim 6, wherein
the element region further includes an insulating film provided on the front surface of the semiconductor element, and
the barrier layer also covers a front surface of the insulating film that extends from the active region to the element region.

8. The semiconductor device as set forth in claim 7, wherein
the insulating film has therein a contact hole through which the semiconductor element is electrically connected to the electrode containing aluminum, and
the barrier layer also covers a side wall of the contact hole.

9. The semiconductor device as set forth in claim 8, wherein
when the semiconductor substrate is seen from above, the barrier layer occupies a larger region than the element region.

10. The semiconductor device as set forth in claim 9, wherein
the gate structure in the active region further includes:
a gate electrode; and
the barrier layer positioned on a front surface of the gate electrode, and
an end, in the active region, of the barrier layer that faces the element region is spaced away by no less than 10 µm and no more than 20 µm from an end, in the element region, of the barrier layer that faces the active region.

11. The semiconductor device as set forth in claim 10, further comprising
an interlayer insulating film between the electrode positioned on the front surface of the gate electrode and the gate electrode, wherein
the barrier layer is provided between the electrode positioned closer to the front surface of the gate structure than the gate electrode is and the interlayer insulating film.

12. A semiconductor comprising:
a semiconductor substrate;
an electrode provided on a front surface of the semiconductor substrate, the electrode containing aluminum;
a barrier layer provided between the semiconductor substrate and the electrode; and
an edge termination structure extending along an edge of the semiconductor substrate, wherein
the barrier layer includes a first titanium nitride layer, a first titanium layer, a second titanium nitride layer and a second titanium layer in the stated order with the first titanium nitride layer being positioned closest to the semiconductor substrate,
the barrier layer is provided on a front surface of the edge termination structure, and
the barrier layer on the edge termination structure has a floating potential.

13. The semiconductor device as set forth in claim 12, wherein
the electrode containing aluminum does not cover a front surface of the barrier layer on the edge termination structure.

* * * * *